United States Patent [19]
Tam et al.

[11] Patent Number: 5,105,250
[45] Date of Patent: Apr. 14, 1992

[54] HETEROJUNCTION BIPOLAR TRANSISTOR WITH A THIN SILICON EMITTER

[75] Inventors: Gordon Tam; Lynnita K. Knoch, both of Chandler, Ariz.

[73] Assignee: Motorola, Inc., Schaumburg, Ill.

[21] Appl. No.: 594,576

[22] Filed: Oct. 9, 1990

[51] Int. Cl.$^5$ .................. H01L 29/72; H01L 29/161; H01L 29/04
[52] U.S. Cl. ........................................ 357/34; 357/35; 357/16; 357/59
[58] Field of Search ................... 357/35, 34, 16, 59 H

[56] References Cited

U.S. PATENT DOCUMENTS 5,001,534 3/1991 Lunardi et al. ................. 357/34

FOREIGN PATENT DOCUMENTS 8808206 10/1988 European Pat. Off. ............ 357/34

OTHER PUBLICATIONS

"Si/Si$_{1-x}$Ge$_x$ Heterojunction Bipolar Transistors Produced by Limited Reaction Processing", by C. A. King et al., published in IEEE, Electron Device Letters, vol. 10, No. 2, on Feb. 1989, pp. 52-54.

*Primary Examiner*—Rolf Hille
*Assistant Examiner*—Wael Fahmy
*Attorney, Agent, or Firm*—Miriam Jackson; Joe E. Barbee

[57] ABSTRACT

A heterojunction bipolar transistor having a thin, lightly doped, silicon emitter disposed on a silicon-germanium base layer exhibits low emitter resistance and low emitter-base capacitance. The lightly doped silicon emitter maintains the bandgap differential between silicon-germanium and silicon. The silicon emitter is fabricated such that the silicon emitter will be substantially depleted at zero bias, resulting in low emitter-base resistance and emitter resistance.

10 Claims, 1 Drawing Sheet

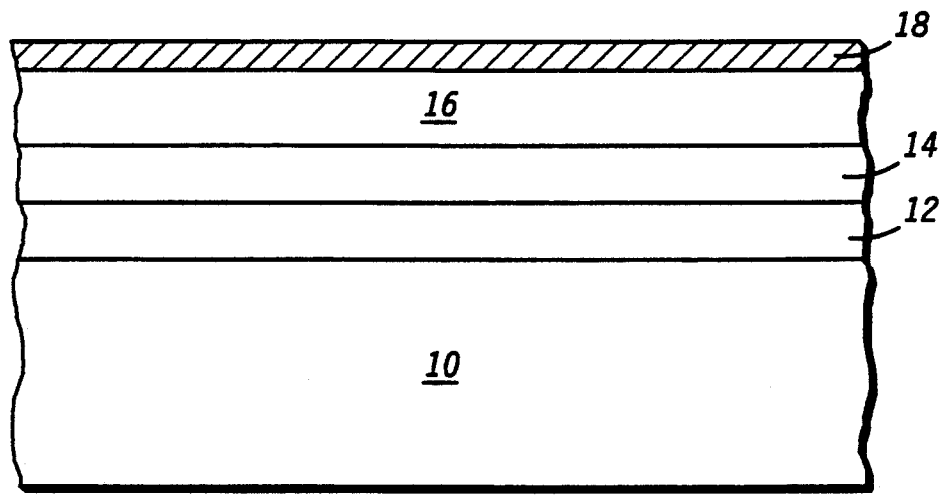
FIG. 1
FIG. 2
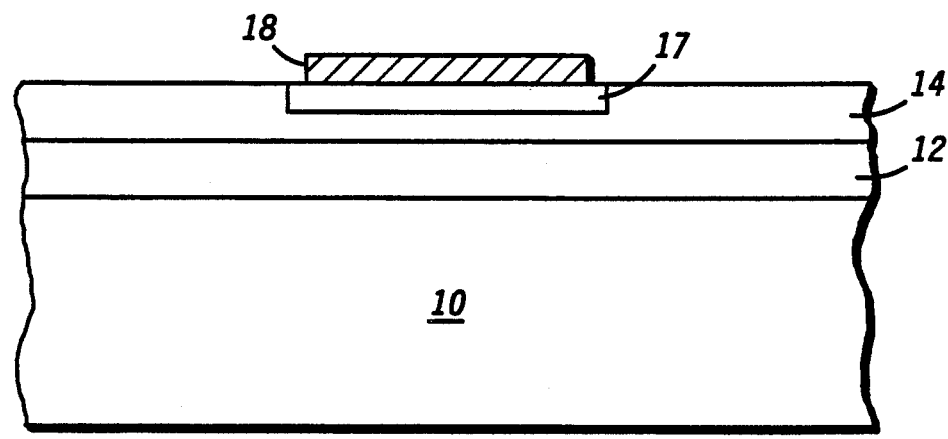

HETEROJUNCTION BIPOLAR TRANSISTOR WITH A THIN SILICON EMITTER

BACKGROUND OF THE INVENTION

This invention relates, in general, to semiconductor devices, and more particularly, to a heterojunction bipolar transistor.

Heterojunction bipolar transistors exhibit electrical characteristics which are advantageous over the electrical characteristics of homojunction bipolar transistors. Silicon-germanium heterojunction bipolar transistor processing is compatible with existing silicon processing. Thus, silicon-germanium heterojunction bipolar transistors are preferred over other heterojunction bipolar transistors. In particular, silicon-germanium heterojunction bipolar transistors exhibit high emitter injection efficiency, reduced charge storage in the emitter, reduced or eliminated hole injection into the emitter. These characteristics are obtained because of the bandgap differential between the silicon and silicon-germanium metallurgical junction.

A silicon-germanium heterojunction bipolar transistor of the prior art consists of an N-type silicon collector, a P-type silicon-germanium base, and an N-type polysilicon layer. The N-type dopant from the polysilicon is diffused into the base to form an emitter region. The problem with this structure is that boron diffuses into the polysilicon layer or arsenic diffuses into the silicon-germanium base during the formation of the emitter. This diffusion degrades the bandgap differential by moving the metallurgical junction from the silicon-germanium and polysilicon interface into either the polysilicon layer or into the silicon-germanium base. Thus, the advantageous electrical characteristics described above are not exhibited.

A way of maintaining the metallurgical junction at the silicon-germanium and polysilicon interface is to prevent the diffusion of boron or arsenic from the respective layers. A structure in which the polysilicon layer is used as the emitter would solve this problem because the diffusion of boron or arsenic can be prevented. However, in this structure, the interface between the polysilicon layer and the silicon-germanium layer is poor, which results in the transistor exhibiting poor electrical characteristics, such as high leakage.

A transistor which solves this interface problem has been disclosed by King et al, in an article entitled, "Si/-Si$_{1-x}$Ge$_x$ Heterojunction Bipolar Transistors Produced by Limited Reaction Processing," published in IEEE Electron Device Letters, Vol. 10, No. 2, on Feb. 1989. The use of a thick silicon emitter of approximately 4,000 angstroms in thickness, instead of the polysilicon emitter eliminates the interface problem, and maintains the bandgap differential between the silicon-germanium layer and the silicon emitter layer in this case. However, in this structure, the thick silicon emitter must be lightly doped to avoid breakdown voltage problems and to avoid high emitter-base capacitance. A lightly doped, thick emitter exhibits high emitter resistance. Thus, it would be desirable to fabricate a heterojunction bipolar transistor in which the bandgap differential is ensured and also where emitter resistance and capacitance is low.

Accordingly, it is an object of the present invention is to provide an improved heterojunction bipolar transistor.

Another object of the present invention is to provide a heterojunction bipolar transistor having low emitter-base capacitance and low emitter resistance.

A further object of the present invention to provide a heterojunction bipolar transistor in which the bandgap differential between silicon and silicon-germanium is maintained.

SUMMARY OF THE INVENTION

The above and other objects and advantages of the present invention are achieved by a heterojunction bipolar transistor having a thin, lightly doped, silicon emitter disposed on a silicon-germanium base layer. The lightly doped silicon emitter maintains the bandgap differential between silicon-germanium and silicon. The silicon emitter is fabricated such that it will be depleted at zero bias so that emitter-base capacitance and emitter resistance is low. In one embodiment, a polysilicon contact layer may be formed on the silicon emitter and can be heavily doped to further reduce emitter resistance. In a second embodiment, a thin ohmic contact region may be formed in the silicon emitter instead of the polysilicon contact layer.

BRIEF DESCRIPTION OF THE DRAWINGS

FIG. 1 illustrates an enlarged, cross-sectional portion of a first embodiment of the present invention; and FIG. 2 illustrates an enlarged, cross-sectional portion of a second embodiment of the present invention.

DETAILED DESCRIPTION OF THE INVENTION

FIG. 1 illustrates an enlarged, cross-sectional view of a portion of a heterojunction bipolar transistor in a first embodiment of the present invention. What is shown is a silicon layer 10 which acts as the collector of the heterojunction bipolar transistor, a silicon-germanium layer 12 which acts as the base, a thin silicon layer 14 formed on the silicon-germanium layer 12 which acts as the emitter, and a polysilicon layer 16 which acts as the emitter contact. A metal contact layer 18 is formed on polysilicon layer 16.

Silicon collector layer 10 is preferably doped N-type, using arsenic or antimony as a dopant. Silicon-germanium base layer 12 is preferably doped P-type, using boron as a dopant at approximately $1 \times 10^{19}$ to $3 \times 10^{19}$ atoms/cm$^3$. The thickness of silicon-germanium base layer 12 is preferably approximately 500 angstroms. Thin silicon layer 14 is preferably lightly doped N-type, using arsenic as a dopant at approximately $8 \times 10^{16}$ to $3 \times 10^{17}$ atoms/cm$^3$. The thickness of silicon layer 14 is preferably approximately 500 to 1500 angstroms. The thickness and doping of silicon layer 14 should be chosen such that silicon layer 14 will be substantially depleted at zero bias during normal operation. This is necessary in order to reduce emitter-base capacitance and emitter resistance. If silicon layer 14 is too thick, for example 4,000 angstroms as is described in the prior art, silicon layer 14 will not be depleted at zero bias and emitter resistance will be high. Polysilicon layer 16 is preferably heavily doped N-type using arsenic as a dopant.

After doping polysilicon layer 16, it is critical to anneal the heterojunction bipolar transistor by rapid thermal anneal to prevent degradation of the bandgap differential of silicon layer 14 and silicon-germanium layer 12 by preventing the diffusion of arsenic and boron from silicon-germanium layer 12 and silicon layer 14. Polysilicon layer 16 is heavily doped in order to further lower emitter resistance. In a preferred embodiment, polysilicon layer 16 is doped using arsenic as a dopant at a level of approximately greater than $1 \times 10^{19}$ atoms/cm$^3$. The above layers are formed using techniques well known in the art. Note that only the active region of a heterojunction bipolar transistor is shown and described, however, this structure may be readily incorporated into many heterojunction bipolar process.

By including silicon layer 14 the metallurgical junction will be at the interface between silicon layer 14 and silicon-germanium layer 12. Thus, the advantage of the bandgap differential is not lost as in the prior art. In addition, the heterojunction bipolar transistor of the present invention has low emitter resistance and low emitter-base capacitance. The low emitter resistance is obtained by forming a heavily doped polysilicon layer 16. The low emitter-base capacitance is obtained by designing silicon layer 14 to be substantially depleted during operation. The heterojunction bipolar transistor of the present invention is thus a very high speed device that can be used for high speed digital and microwave applications.

FIG. 2 illustrates an enlarged, cross-sectional view of a portion of a heterojunction bipolar transistor in a second embodiment of the present invention. The same elements shown in FIG. 1 are referenced by the same numerals. FIG. 2 illustrates a structure similar to that of FIG. 1, however, in FIG. 2 polysilicon layer 16 is not utilized. In addition, silicon layer 14 is preferably slightly thicker than in FIG. 1. Silicon layer 14 is preferably approximately 1,000 to 2,500 angstroms so that a shallow emitter contact region 17 may be formed therein. Emitter contact region 17 is preferably formed by using a heavy dose of arsenic, and is just deep enough to provide ohmic contact to metal layer 18. In this second embodiment, as in the first embodiment, silicon emitter layer 14 is thin enough so that it is substantially depleted during operation. Thus, the structure of FIG. 2 also exhibits good electrical properties.

As can be readily seen, the heterojunction bipolar transistor of the present invention maintains the bandgap differential, thus exhibits high emitter injection efficiency, reduced charge storage in the emitter, reduced or eliminated hole injection into the emitter. In addition the heterojunction bipolar transistor of the present invention exhibits low emitter resistance and emitter-base capacitance by utilizing a thin silicon emitter layer.

We claim:

1. A heterojunction bipolar transistor, comprising:
   a collector;
   a silicon-germanium base disposed on the collector;
   a thin silicon emitter disposed on the silicon-germanium base, wherein a metallurgical junction is maintained at the silicon-germanium base and the thin silicon emitter interface; and
   a polysilicon layer disposed on the thin silicon emitter.

2. The heterojunction bipolar transistor of claim 1 wherein the silicon emitter is of a thickness where the thin silicon emitter is substantially depleted at zero bias.

3. The heterojunction bipolar transistor of claim 2 wherein the silicon emitter is of a thickness of approximately 500 to 2,500 angstroms.

4. A heterojunction bipolar transistor comprising:
   a collector;
   a silicon-germanium base formed on the collector;
   a thin silicon emitter formed on the silicon-germanium base, wherein the silicon emitter has a thickness and a doping level such that it is substantially depleted during normal operation, and wherein a metallurgical junction is maintained at the silicon-germanium base and the thin silicon emitter interface; and
   a polysilicon layer formed on the silicon layer.

5. The heterojunction bipolar transistor of claim 4 wherein the silicon emitter is of a thickness of approximately 500 to 2,500 angstroms.

6. The heterojunction bipolar transistor of claim 4 wherein the polysilicon layer is heavily doped.

7. A heterojunction bipolar transistor, comprising:
   an N-type collector;
   a P-type silicon-germanium base formed on the collector;
   an N-type, thin, lightly doped silicon emitter formed on the silicon-germanium base, wherein a metallurgical junction is maintained at the P-type silicon-germanium base and the N-type, thin, lightly doped silicon emitter interface; and
   an N-type, heavily doped polysilicon layer formed on the silicon layer.

8. The heterojunction bipolar transistor of claim 7 wherein the thin, lightly doped silicon emitter is substantially depleted during normal operation.

9. The heterojunction bipolar transistor of claim 8 wherein the thin, lightly doped silicon emitter is doped at approximately $8 \times 10^{16}$ to $3 \times 10^{17}$ atoms/cm$^3$.

10. The heterojunction bipolar transistor of claim 7 wherein the heavily doped polysilicon layer is doped at approximately $1 \times 10^{19}$ atoms/cm$^3$.

* * * * *